(12) United States Patent
Hamidi et al.

(10) Patent No.: US 8,184,685 B2
(45) Date of Patent: May 22, 2012

(54) SYSTEM AND METHOD FOR IDENTIFYING A NON-PREDETERMINED INPUT DATA RATE

(75) Inventors: Madjid Hamidi, San Diego, CA (US); Tim Giorgetta, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 853 days.

(21) Appl. No.: 12/275,167

(22) Filed: Nov. 20, 2008

(65) Prior Publication Data

US 2010/0124264 A1 May 20, 2010

(51) Int. Cl.
*H04B 3/46* (2006.01)
(52) U.S. Cl. ...................................................... 375/225
(58) Field of Classification Search .................... 375/225
See application file for complete search history.

(56) References Cited

U.S. PATENT DOCUMENTS

| 7,251,296 B2* | 7/2007 | Kennedy et al. ............... 375/327 |
| 2005/0147197 A1* | 7/2005 | Perrott .......................... 375/376 |

* cited by examiner

*Primary Examiner* — Juan A Torres
(74) *Attorney, Agent, or Firm* — Law Office of Gerald Maliszewski; Gerald Maliszewski

(57) ABSTRACT

A system and method are provided for identifying the data rate of an input signal in a communications receiver. The method supplies a candidate frequency from a list of potential input data rate frequencies. A first test is performed, attempting to phase-lock a coded input data signal using a reference signal at the candidate frequency. If the input signal is phase-locked, a second test is performed of monitoring a phase detector output signal for the occurrence of a phase-lock interrupt. If a phase-lock interrupt is not monitored, a third test is performed of harmonic band detection. In response to passing the first, second, and third tests, the candidate frequency is selected as the reference frequency and the input data signal is decoded. If the first, second, or third test is failed, an alternate candidate frequency is supplied from the list and the tests are repeated, beginning with the first test.

18 Claims, 3 Drawing Sheets

(12) United States Patent
US 8,184,685 B2

SYSTEM AND METHOD FOR IDENTIFYING A NON-PREDETERMINED INPUT DATA RATE

BACKGROUND OF THE INVENTION

1. Field of the Invention

This invention generally relates to non-synchronous digital communications and, more particularly, to a system and method for determining a non-predetermined input data rate of a serial communications stream.

2. Description of the Related Art

A synchronous communications network digital payload data is carried on a particular clock frequency within a synchronous message format. This payload data may include both asynchronous digital data and synchronous digital data originating at a different data rate in a foreign digital network. The Synchronous Optical Network (SONET) and its European counterpart the Synchronous Digital Hierarchy (SDH) provide a standard format of transporting digital signals having various data rates, such as a DS-0, DS-1, DS-1C, DS-2, or a DS-3 signal and their European counterparts within a Synchronous Payload Envelope (SPE), or a container that is a part of a SONET/SDH STS-N/STM-N message frame. In addition to the digital data that is mapped and framed within the SPE or container, the STS-N/STM-N message frame also includes overhead data that provides for coordination between various network elements.

As is known, a phase-locked loop (PLL) is used to recover the clock and data signal, and is able to smooth out some phase jumps caused by pointer adjustments or asynchronous stuff bits. A typical optical network transceiver or PHY unit is expect to be able to operate at a number of different data rates, depending upon the network signal protocol being used. The optical transceiver may be hardcoded or hardwired to operate at a particular predetermined frequency, but this process requires user intervention, and limits to unit to operating at only one frequency. Alternately, the transceiver can be designed to interact with the backplane, which "knows" the optical data rate, and change frequencies in response to an optical transceiver-to-electrical backplane protocol. However, the use of such a protocol adds to the cost and complexity of the transceiver. As another alternative, the optical transceiver can be designed to acquire a non-predetermined optical data rate independent of communications with the backplane. Again however, such an alternative needlessly adds to the cost and complexity of the transceiver, since the backplane knows the optical data.

It would be advantageous if an optical transceiver could acquire a non-predetermined input data rate, independent of user intervention or backplane communications, by checking the input signal against a finite list of candidate frequencies.

SUMMARY OF THE INVENTION

Accordingly, a method is provided for identifying the data rate of an input signal in a communications receiver. The method supplies a candidate frequency from a list of potential input data rate frequencies. A first test is performed, attempting to phase-lock a coded input data signal using a reference signal at the candidate frequency. If the input signal is phase-locked, a second test is performed of monitoring a phase detector output signal for the occurrence of a phase-lock interrupt. If a phase-lock interrupt is not monitored, a third test is performed of harmonic band detection. In response to passing the first, second, and third tests, the candidate frequency is selected as the reference frequency and the input data signal is decoded. If the first, second, or third test is failed, an alternate candidate frequency is supplied from the list and the tests are repeated, beginning with the first test.

Even after the selection of the candidate frequency, the method continues to perform the three tests. If, subsequent to selecting the candidate frequency, one of the three tests is failed, the selected candidate frequency is resupplied, based upon the assumption that the input signal was momentarily interrupted or degraded. However, if one of the tests is failed upon the resupply of the (previously) selected candidate frequency, an alternate candidate frequency is supplied from the list.

Additional details of the above-described method, and a system for identifying the data rate of an input signal in a communications receiver, are provided below.

DETAILED DESCRIPTION

Figure 1:
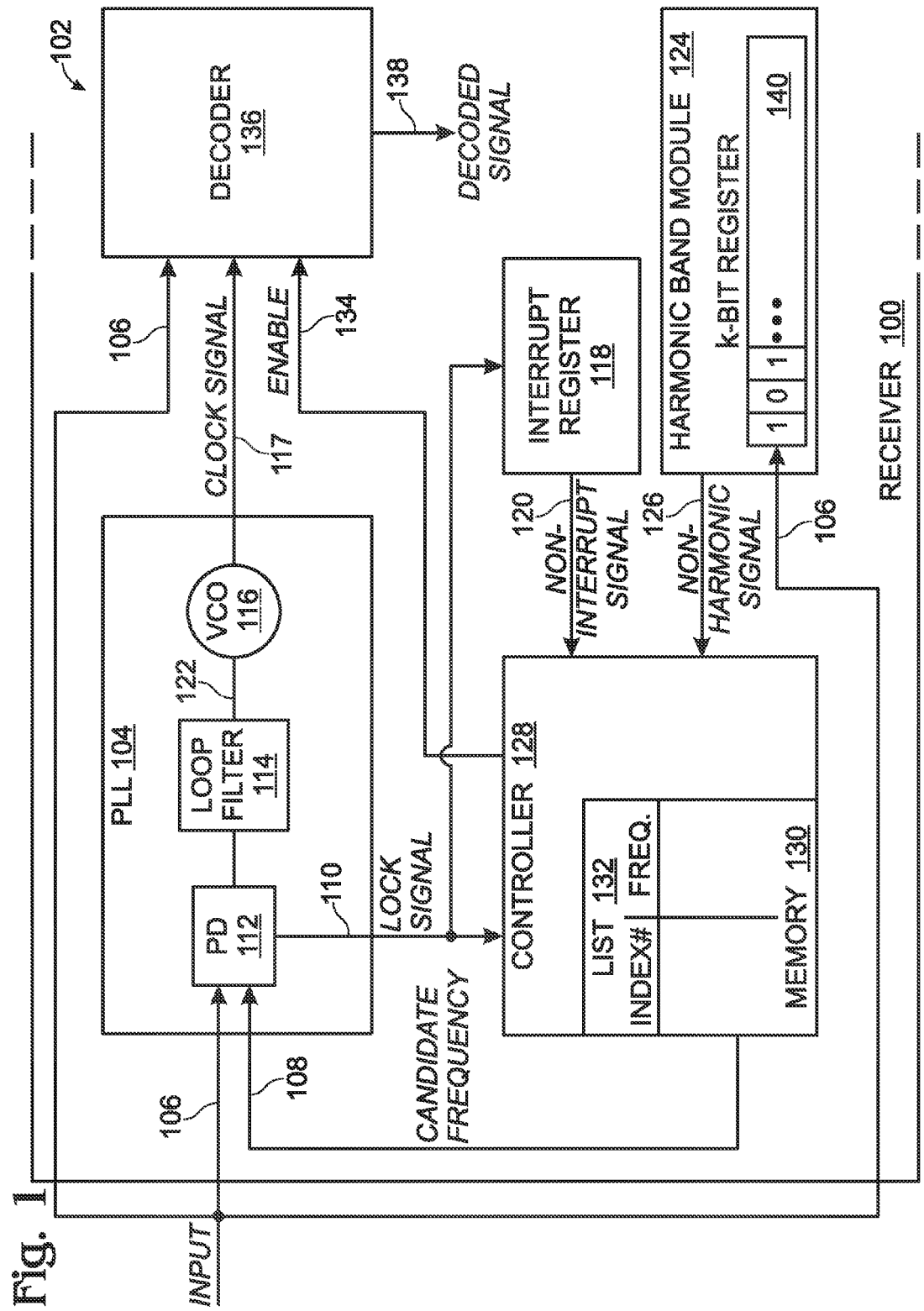
FIG. 1 is a schematic block diagram of a communications receiver, with a system for identifying the data rate of an input signal.

FIG. 1 is a schematic block diagram of a communications receiver 100, with a system for identifying the data rate of an input signal. The system 102 comprises a phase-locked loop (PLL) 104 having an input on line 106 to accept a coded input data signal having a non-predetermined data rate. In some aspects, the input data signal is an electrical signal that has been converted from an optical signal (not shown). For example, the receiver 102 may accept SONET, Gigabit Ethernet (GBE), Fibre Channel (FC), D1 Video, DTV, DV6000-1, HDTV, ESCON/FICON, digitally wrapped data, video, or FDDI signals.

The PLL 104 has an input on line 108 to accept a candidate frequency to use as a reference, and an output on line 110 to supply a lock signal indicating when the candidate frequency is phase-locked to the coded input data signal. A typical PLL may include a phase detector (PD) 112, a loop filter 114, and a voltage controlled oscillator (VCO) 116. In one aspect, the receiver is a clock and data recovery (CDR) unit and the VCO supplies a data clock signal on line 117. Note: in some aspect (not shown), a frequency detector is used in the loop, instead of a phase detector, and tests are performed to determine if the loop is frequency-locked.

An interrupt register 118 has an input on line 110 to monitor a change of state in the lock signal indicating a momentary loss of phase-lock. The register 118 has an output on line 120 to supply a non-interrupt signal indicative of no momentary loss of phase-lock (phase-lock with no interrupts). In some aspects the lock signal is a filtered version of the VCO control signal on line 122.

A harmonic band module 124 has an input to accept the coded input data signal on line 106. The harmonic band module 124 determines if the candidate frequency is harmonically related to the coded input data signal and provides a non-harmonic signal at an output on line 126, which is indicative of the candidate frequency being non-harmonically related to the coded input data signal. That is, the PLL is not locked on a harmonic of the input data rate.

A controller 128 includes a memory 130 with a list 132 of predetermined frequencies, and an output on line 108 to supply an initial candidate frequency from the list 132. The controller 128 has an output on line 134 to supply an enable signal in response to receiving the lock signal on line 110, the non-interrupt signal on line 120, and the non-harmonic signal on line 126 for a selected candidate frequency. In one aspect, the controller 128 supplies the enable signal in response to sequentially receiving the lock, non-interrupt, and non-harmonic signals. The controller 128 supplies an alternate candidate frequency from the list 132 in response to not receiving one (or more) of the lock, non-interrupt, and non-harmonic signals, for a particular candidate frequency.

A decoder 136 has an input of line 106 to accept the input data signal, an input on line 117 to accept the data clock, an input on line 134 to accept the enable signal, and an output on line 138 to supply a decoded signal in response to receiving the enable signal. Note: the decoder need not be located in the receiver 100.

In one aspect, the interrupt register 118 is loaded with an interrupt bit in response to the momentary loss of the lock signal on line 110, and the controller 128 checks the interrupt register (line 120) to determine if the interrupt bit has been loaded. The interrupt bit may be referred to as a "sticky" bit, as the purpose of the register is to record a momentary event with a locked logic level (e.g., "1") signal. The controller may reset the interrupt register 118 after each check. For example, the controller 128 periodically checks a Read Clear interrupt register 118 beginning at the reception of the lock signal on line 110, and initially determines a non-interrupt signal in response to failing to read an interrupt bit on line 120 after a plurality of checks. To continue the example, the controller 128 may determine that a non-interrupt condition exists if no interrupt bit is detected in three checks, performed within 100 nanoseconds of receiving the lock signal on line 110.

The harmonic band module 124 checks for a bit transition pattern in the coded input data signal over a plurality of candidate frequency cycles. The bit transition pattern can be either a "010" or a "101". In one aspect, the harmonic band module 124 includes a k-bit register 140 for recording a stream of received bits. The harmonic band module 124 checks for the bit transition pattern over N candidate frequency cycles, where $N=2^k$. Alternately stated, the circuit 128 raises an alarm when the circuit does not detect a "101" transition or "010" transition in the data stream, within N number of consecutive clock cycle, where $N=2^{\wedge}$(harmonic band register bit length). For example, the maximum value of N may equal 16. Thus, it should be understood that the harmonic band test occurs in the time domain, as opposed to the frequency domain. In one aspect, a specific coding scheme compares the transmission bit from one to zero, or from zero to one. The circuit determines the pulse width of the signal (bit combinations), and indirectly calculates the harmonic.

As shown, the controller 128 may establish a list 132 of potential input data rate frequencies cross-referenced to list index numbers. The controller supplies the initial candidate frequency associated with an initial index number. The controller 128 supplies alternate candidate frequencies from the list 132 by incrementing the initial index number using a predetermined algorithm, and supplying the candidate frequency associated with the incremented index number. In one aspect, the controller 128 supplies a previously selected candidate frequency as the initial candidate frequency. For example, the last know frequency to be successfully locked may be supplied as the initial candidate.

Subsequent to selecting the candidate frequency, if the controller 128 fails to receive one or more of the lock, non-interrupt, or non-harmonic signals, the controller resupplies the selected candidate frequency. If, after the resupply of the selected candidate frequency, the controller fails to receive one of more of the lock, non-interrupt, or non-harmonic signals, the controller 128 supplies an alternate candidate frequency from the list 132.

Note, although the system has been depicted as hardware elements, some elements may be enabled, in part, as a routine of microprocessor instructions, which are stored in a memory and operated on using a microprocessor (nor shown).

Functional Description

In one exemplary implementation, the receiver of FIG. 1 is programmed to operate at one of 15 data rates. These rates may be loaded via external pins by a user. These pre-programmed settings eliminate the requirement for the user to program the PLL to one particular frequency.

Figure 2:
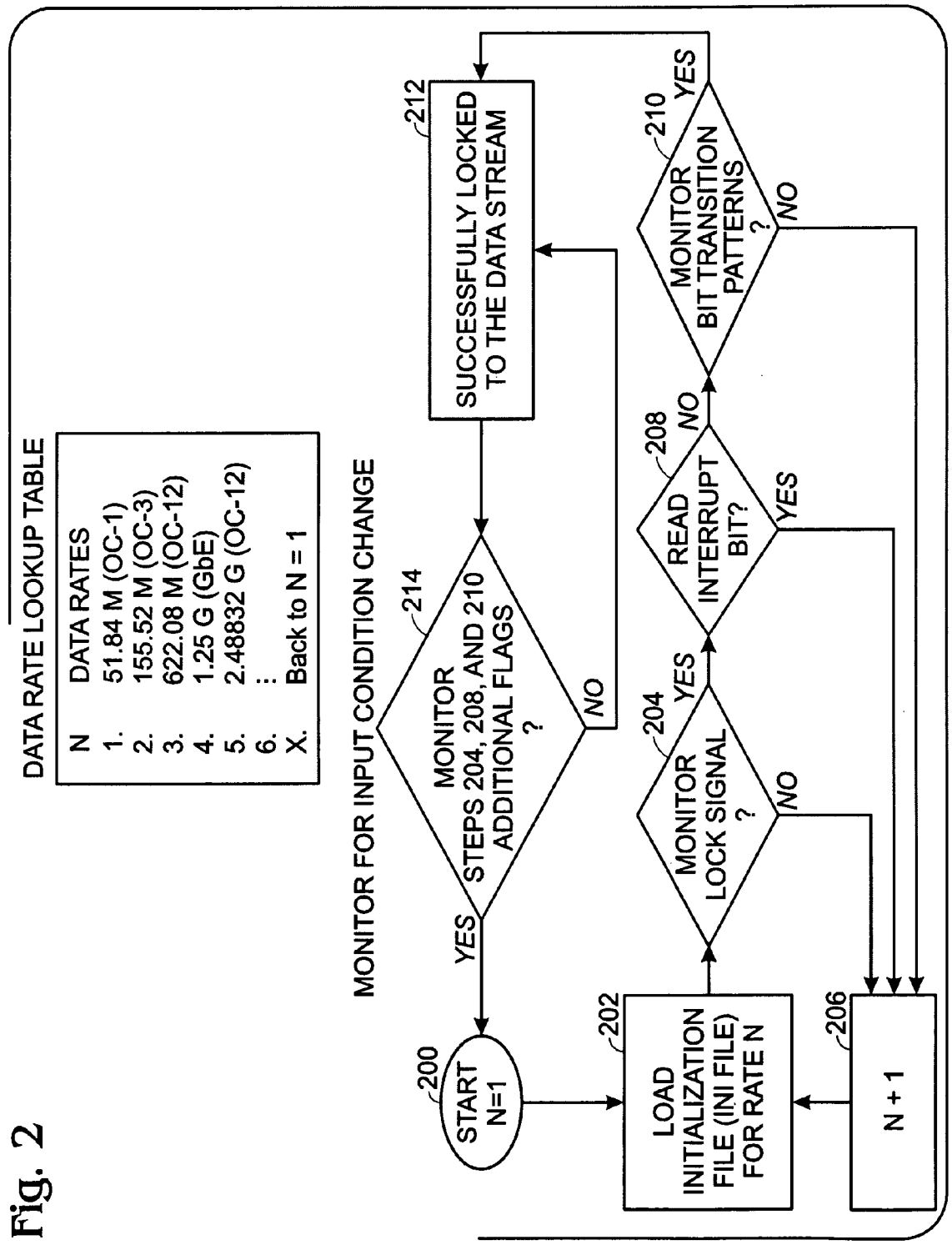
FIG. 2 is a first flowchart illustrating the operation of the system depicted in FIG. 1.

FIG. 2 is a first flowchart illustrating the operation of the system depicted in FIG. 1. At Step 200 the device is powered up, and all clocks and data are stabilized. The candidate frequency index number N is initially selected for the first candidate data rate, which may for example be the lowest data rate in the associated look-up table. In one aspect, the algorithm requires that the data rates to be tested progressively, from lowest to highest frequency. In Step 202 the algorithm loads an Initialization File (INI File) with data based on the data rate for the value of N in the look-up table. This INI file includes the settings for PLL bandwidth and VCO band selection. As the controller increments its search through the different rates (N=N+1), a new and unique INI file is loaded for each data rate. In one aspect, the receiver is given a predetermined duration of time (e.g., 1 ms) to acquire the incoming signal after the INI file has been loaded, before proceeding to Step 204.

In Step 204 the lock signal is monitored to determine if the candidate frequency can be used to lock to the input data signal. If the device is declared not locked, and the algorithm proceeds to Step 206, loading the INI file for the next candidate rate (N+1), and then proceeds to Step 202. If the device is locked to the incoming data rate, the algorithm initiates the lock interrupt check, Step 208.

As the device may be in hunt mode upon start up (searching for the incoming signal), the lock interrupt indicator (Step 208) may rapidly toggle between high and low states, possibly providing erroneous results. By reading the lock interrupt register a number of times (e.g., three times), and confirming the lock state for all the reads, the PLL is declared permanently locked and the algorithm moves on to its next confirmation check. In Step 210 a search is made for a 010 or 101 bit transition pattern. If the pattern is not detected, then a loss of lock has occurred. The algorithm proceeds to Step 206, increments to the next data rate (N=N+1), and then proceeds back to Step 202.

In Step 212 the device is declared to be locked and the candidate frequency is selected. Step 214 continually checks the validity of selected frequency, periodically monitoring the lock signal, non-interrupt signal, and non-harmonic signal. If at any time during the operation of the device the algorithm detects an error as defined in Steps 204, 208, and 210, then the algorithm proceeds back to Step 200. In one aspect, N is set to supply the candidate frequency previously selected in Step 212.

Figure 3:
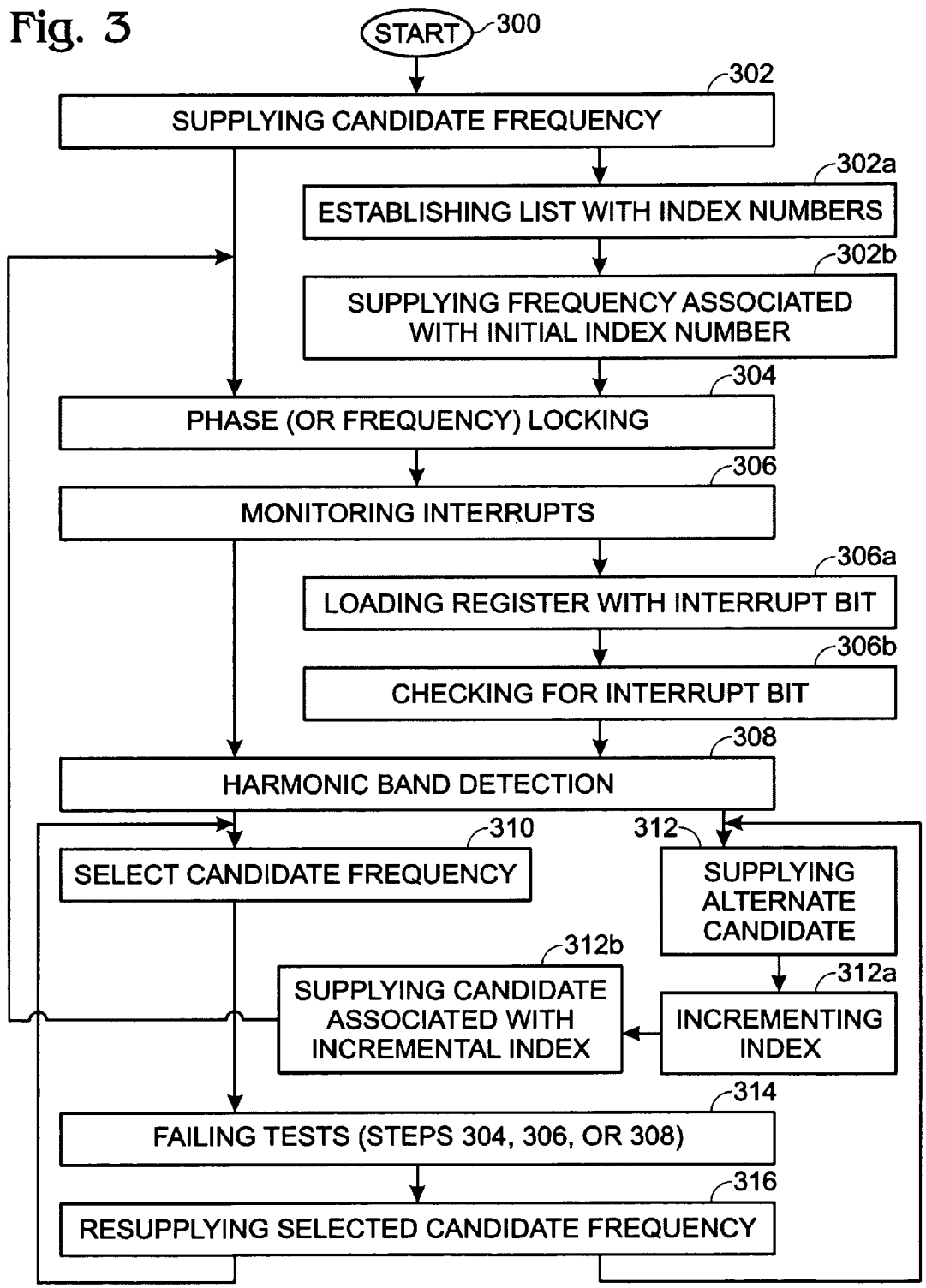
FIG. 3 is a flowchart illustrating a method for identifying the data rate of an input signal in a communications receiver.

FIG. 3 is a flowchart illustrating a method for identifying the data rate of an input signal in a communications receiver. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 300.

Step 302 supplies a candidate frequency from a list of potential input data rate frequencies. Step 304 performs a first test of attempting to phase-lock (or frequency-lock) a coded input data signal using a reference signal at the candidate frequency. In response to phase-locking the input data signal, Step 306 performs a second test of monitoring a phase detector output signal for the occurrence of a phase-lock (frequency-lock) interrupt. In response to failing to monitor a phase-lock interrupt, Step 308 performs a third test of harmonic band detection. In response to passing the first, second, and third tests, Step 310 selects the candidate frequency as the reference frequency and decodes the input data signal. In response to failing one or more of the first, second, and third tests, Step 312 supplies an alternate candidate frequency from the list and performs the first test.

In one aspect, monitoring for the occurrence of the phase-lock interrupt in Step 306 includes substeps. Step 306*a* loads an interrupt register with an interrupt bit in response to the occurrence of a loss of phase-lock. Step 306*b* checks the interrupt register to determine if an interrupt bit has been loaded. For example, Step 306*b* may periodically check the interrupt register beginning at the completion of the first test, and initially determine the non-occurrence of a phase-lock interrupt in response to failing to read an interrupt bit after a first plurality of checks.

In another aspect, performing harmonic band detection in Step 308 includes checking for a bit transition pattern in the coded input data signal over a plurality of candidate frequency cycles. The bit transition may be a 010 or 101. For example, the bit transition pattern may be checked by recording a stream of received bits in a k-bit counter, and checking for the bit transition pattern over N candidate frequency cycles, where $N=2^k$.

In one aspect, supplying the candidate frequency from the list of potential input data rate frequencies in Step 302 includes substeps. Step 302*a* establishes a list of potential input data rate frequencies cross-referenced to list index numbers, and Step 302*b* supplies a candidate frequency associated with an initial index number. In one aspect, Step 302*b* supplies a previously selected candidate frequency as the initial candidate. Then, supplying the alternate candidate frequency from the list in Step 312 includes the following substeps. Step 312*a* increments the initial index number in response to a predetermined algorithm, and Step 312*b* supplies the candidate frequency associated with the incremented index number.

Subsequent to selecting the candidate frequency (Step 310), Step 314 fails one or more of the three tests (Steps 304, 306, and 308). Step 316 resupplies the (previously) selected candidate frequency. In response to failing one or more of the three tests (Steps 304, 306, and 308), the method returns to Step 312 of supplying an alternate candidate frequency from the list.

A system and method have been provided for identifying the data rate of an input data signal. Some examples of specific criteria and measurement tests have been provided to illustrate the invention. However, the invention is not limited to merely these examples. Other variations and embodiments of the invention will occur to those skilled in the art.

We claim:

1. In a communications receiver, a method for identifying the data rate of an input signal, the method comprising:
   supplying a candidate frequency from a list of potential input data rate frequencies;
   performing a first test of attempting to phase-lock a coded input data signal using a reference signal at the candidate frequency;
   in response to phase-locking the input data signal, performing a second test of monitoring a phase detector output signal for the occurrence of a phase-lock interrupt;
   in response to failing to monitor a phase-lock interrupt, performing a third test of harmonic band detection;
   in response to passing the first, second, and third tests, selecting the candidate frequency as the reference frequency and decoding the input data signal; and,
   in response to failing a test selected from a test group consisting of the first, second, and third tests, supplying an alternate candidate frequency from the list and performing the first test.

2. The method of claim 1 wherein monitoring for the occurrence of the phase-lock interrupt includes:
   loading an interrupt register with an interrupt bit in response to the occurrence of a loss of phase-lock; and,
   checking the interrupt register to determine when an interrupt bit has been loaded.

3. The method of claim 2 wherein checking the interrupt register includes:
   periodically checking the interrupt register beginning at the completion of the first test; and,
   initially determining a non-occurrence of a phase-lock interrupt in response to failing to read an interrupt bit after a first plurality of checks.

4. The method of claim 1 wherein performing harmonic band detection includes checking for a bit transition pattern in the coded input data signal, selected from a group consisting of 010 and 101, over a plurality of candidate frequency cycles.

5. The method of claim 4 wherein checking for bit transition pattern over the plurality of candidate frequency cycles includes:
   recording a stream of received bits in a k-bit counter; and, checking for the bit transition pattern over N candidate frequency cycles, where $N=2^k$.

6. The method of claim 1 wherein supplying the candidate frequency from the list of potential input data rate frequencies includes:
   establishing a list of potential input data rate frequencies cross-referenced to list index numbers; and
   supplying a candidate frequency associated with an initial index number;
   wherein supplying the alternate candidate frequency from the list in response to failing the test includes:
      incrementing the initial index number in response to a predetermined algorithm; and,
      supplying the candidate frequency associated with the incremented index number.

7. The method of claim 6 wherein supplying the candidate frequency associated with the initial index number includes supplying a previously selected candidate frequency.

8. The method of claim 1 further comprising:
   subsequent to selecting the candidate frequency, failing a test selected from the test group;
   resupplying the selected candidate frequency; and,
   in response to failing a test from the test group, supplying an alternate candidate frequency from the list.

9. in a communications receiver, a system for identifying the data rate of an input signal, the system comprising:
   a phase-locked loop (PLL) having an input to accept a coded input data signal having a non-predetermined data rate, an input to accept a candidate frequency to use as a reference, and an output to supply a lock signal indicating when the candidate frequency is phase-locked to the coded input data signal;

an interrupt register having an input to monitor a change of state in the lock signal indicating a momentary loss of phase-lock, and an output to supply a non-interrupt signal indicative of mo momentary loss of phase-lock;

a harmonic band module having an input to accept the coded input data signal, the harmonic band module determining when the candidate frequency is harmonically related to the coded input data signal and providing a non-harmonic signal at an output indicative of the candidate frequency being non-harmonically related to the coded input data signal; and, a controller including a list of predetermined frequencies, an output to supply an initial candidate frequency from the list, an output to supply an enable signal in response to receiving the lock, non-interrupt, and non-harmonic signals for a selected candidate frequency, and supplying an alternate candidate frequency from the list in response to not receiving a signal from a signal group consisting of the lock, non-interrupt, and non-harmonic signals, for a candidate frequency.

10. The system of claim 9 wherein the controller supplies the enable signal in response to sequentially receiving the lock, non-interrupt, and non-harmonic signals.

11. The system of claim 9 wherein the interrupt register is loaded with an interrupt bit in response to the momentary loss of the lock signal; and, wherein the controller checks the interrupt register to determine when the interrupt bit has been loaded.

12. The system of claim 11 wherein controller periodical checks the interrupt register beginning at the reception of the lock signal, and initially determines a non-interrupt signal in response to failing to read an interrupt bit after a first plurality of checks.

13. The system of claim 9 wherein the harmonic band module checks for a bit transition pattern in the coded input data signal selected from a group consisting of 010 and 101, over a plurality of candidate frequency cycles.

14. The system of claim 13 wherein the harmonic band module includes a k-bit register for recording a stream of received bits and checks for the bit transition pattern over N candidate frequency cycles, where $N=2^k$.

15. The system of claim 9 wherein the controller establishes a list of potential input data rate frequencies cross-referenced to list index numbers and supplies the initial candidate frequency associated with an initial index number, and wherein the controller supplies the alternate candidate frequency from the list by incrementing the initial index number in response to a predetermined algorithm and supplies the candidate frequency associated with the incremented index number.

16. The system of claim 15 wherein the controller supplies a previously selected candidate frequency as the initial candidate frequency.

17. The system of claim 9 wherein the controller, subsequent to selecting the candidate frequency, fails to receive a signal from the signal group, resupplies the selected candidate frequency, and in response to failing to receive a signal from the signal group, supplies an alternate candidate frequency from the list.

18. The system of claim 9 further comprising:

a decoder having inputs to accept the input data signal, the data clock, and the enable signal, and an output to supply a decoded signal in response to receiving the enable signal.

* * * * *

UNITED STATES PATENT AND TRADEMARK OFFICE
CERTIFICATE OF CORRECTION

PATENT NO.        : 8,184,685 B2
APPLICATION NO.   : 12/275167
DATED             : May 22, 2012
INVENTOR(S)       : Madjid Hamidi It is certified that error appears in the above-identified patent and that said Letters Patent is hereby corrected as shown below:

In Claim 12, column 7, line 33, the word "periodically" has been incorrectly printed as "periodical". Claim 12 should be printed as follows:

12. The system of claim 11 wherein controller periodically checks the interrupt register beginning at the reception of the lock signal, and initially determines a non-interrupt signal in response to failing to read an interrupt bit after a first plurality of checks.

Signed and Sealed this
Tenth Day of July, 2012

David J. Kappos
*Director of the United States Patent and Trademark Office*